United States Patent [19]
Watanabe et al.

[11] Patent Number: 6,034,317
[45] Date of Patent: Mar. 7, 2000

[54] THERMOELECTRIC MODULE

[75] Inventors: Hideo Watanabe, Kawasaki; Fumikazu Kiya, Noboribetsu; Mitsutoshi Ogasawara, Muroran, all of Japan

[73] Assignee: Thermovonics Co., Ltd., Kanagawa, Japan

[21] Appl. No.: 08/954,894

[22] Filed: Oct. 21, 1997

[30] Foreign Application Priority Data

Oct. 22, 1996 [JP] Japan .................................. 8-279525

[51] Int. Cl.[7] .................................................. H01L 35/28
[52] U.S. Cl. ........................ 136/203; 136/201; 136/212; 136/230; 62/3.2
[58] Field of Search ................................. 136/203, 204, 136/230, 242, 201, 212; 62/3.2; 257/467

[56] References Cited

U.S. PATENT DOCUMENTS

| | | | |
|---|---|---|---|
| 3,303,058 | 2/1967 | Sonnenschein | 136/230 |
| 3,509,620 | 5/1970 | Phillips | 29/573 |
| 3,663,307 | 5/1972 | Mole | 136/204 |
| 4,489,742 | 12/1984 | Moore et al. | 136/203 |
| 5,362,983 | 11/1994 | Yamamura et al. | 257/414 |
| 5,409,547 | 4/1995 | Watanabe et al. | 136/204 |

FOREIGN PATENT DOCUMENTS 6-294561  10/1994  Japan .

*Primary Examiner*—Kathryn Gorgos
*Assistant Examiner*—Thomas H. Parsons
*Attorney, Agent, or Firm*—Evenson, McKeown, Edwards & Lenahan, PLLC

[57] ABSTRACT

One of a heat-absorbing-side thermal conductor and a heat-dissipating-side thermal conductor is substantially in a form of a single piece. Plural groups of thermoelectric elements are arranged relative to the single-piece thermal conductor. Corresponding to the plural groups of thermoelectric elements, the other one of the heat-absorbing-side thermal conductor and the heat-dissipating-side thermal conductor is arranged in a form divided into a like number of pieces.

6 Claims, 4 Drawing Sheets

THERMOELECTRIC MODULE

BACKGROUND OF THE INVENTION a) Field of the Invention

This invention relates to a thermoelectric module suitable for use, for example, in a refrigerator, freezer, heating cabinet or dehumidifier, and especially to a thermoelectric module making use of plural groups of thermoelectric elements.

b) Description of the Related Art

FIG. 7 is a schematic front view showing a conventional thermoelectric module which makes use of plural groups of thermoelectric elements (which may hereinafter be referred to as "thermoelectric element groups"). Between a single piece of heat-absorbing-side thermal conductor 51 and a single piece of heat-dissipating-side thermal conductor 52, plural thermoelectric element groups 53a,53b are arranged at a predetermined interval therebetween. The heat-absorbing-side thermal conductor 51 and the heat-dissipating-side thermal conductor 52 are fastened in a stacked direction by bolts 54 made of a synthetic resin. In the drawing, numeral 55 indicates heat-dissipating fins disposed on the heat-dissipating-side thermal conductor 52, and numeral 56 designates lead wires connected to the thermoelectric element groups 53a,53b.

By the fastening force of the bolts 54, close contact has been established between the heat-absorbing-side thermal conductor 51 and the thermoelectric element groups 53a,53b and also between the heat-dissipating-side thermal conductor 52 and the thermoelectric element groups 53a,53b. Although not shown in the drawing, the thermoelectric element groups 53a,53b are each constructed of a predetermined number of heat-absorbing-side electrodes and heat-dissipating-side electrodes and N-type semiconductor chips and P-type semiconductor chips arranged side by side between both the electrodes.

The above-described conventional thermoelectric module is of the construction that the plural thermoelectric element groups 53a,53b are interposed between the single-piece heat-absorbing-side thermal conductor 51 and the single-piece heat-dissipating-side thermal conductor 52 and the heat-absorbing-side thermal conductor 51 and the heat-dissipating-side thermal conductor 52 are fastened together by the bolts 54. If there is a variation in height between the thermoelectric element groups 53a,53b, the higher thermoelectric element group, for example, the thermoelectric element group 53a is therefore strongly pressed by the heat-absorbing-side thermal conductor 51 and the heat-dissipating-side thermal conductor 52 so that the thermoelectric element group 53a may be broken or may produce a large internal stress. On the other hand, no sufficient close contact may be established between the lower thermoelectric element group, for example, the thermoelectric element group 53b and the heat-absorbing-side and heat-dissipating-side thermal conductors 51,52.

For the above-mentioned problem, the conventional thermoelectric module is accompanied by various drawbacks. Namely, it cannot obtain any high thermoelectric conversion efficiency and moreover, is short in service life. Further, to reduce the variation in height between the thermoelectric element group 53a and the thermoelectric element group 53b, strict control of fabrication steps is required, thereby leading to a reduction in productivity.

SUMMARY OF THE INVENTION

An object of the present invention is to eliminate such drawbacks of the conventional art and to provide a thermoelectric module excellent in both performance and productivity.

To achieve the above-described object, the present invention provides a thermoelectric module provided with plural groups of thermoelectric elements arranged between a heat-absorbing-side thermal conductor and a heat-dissipating-side thermal conductor. Either the heat-absorbing-side thermal conductor or the heat-dissipating-side thermal conductor is substantially in a single piece form. The plural groups of thermoelectric elements are arranged relative to the single piece thermal conductor. Corresponding to the plural groups of thermoelectric elements, the other one of the heat-absorbing-side thermal conductor and the heat-dissipating-side thermal conductor is arranged in a form divided into a like plural number of pieces.

Corresponding to the individual groups of thermoelectric elements, the other thermal conductor in the present invention is arranged in the form divided in the like plural number of pieces as described above. Even if there is a variation in height between the groups of thermoelectric elements, close contact can therefore be established between the heat-absorbing-side thermal conductor and the groups of thermoelectric elements and also between the groups of thermoelectric elements and the heat-dissipating-side thermal conductor.

Unlike the conventional thermoelectric module, the thermoelectric module according to the present invention is therefore free of such a problem that semiconductor chips may be broken or internal stress may be produced, and is hence excellent in both performance and service life. Further, improved productivity is available because no strict control of fabrication steps is required.

DETAILED DESCRIPTION OF THE INVENTION AND PREFERRED EMBODIMENTS

Figure 1:
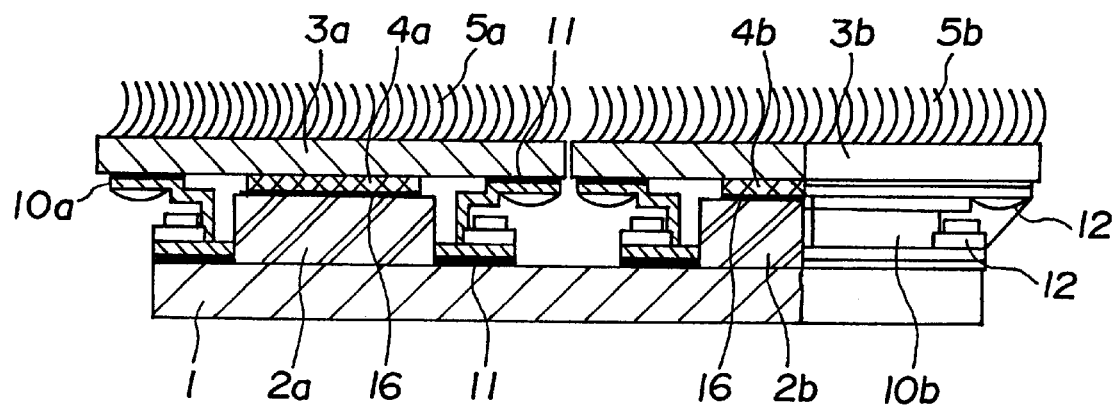
FIG. 1 is a front view of a thermoelectric module according to a first embodiment of the present invention, in which a majority of the thermoelectric module is shown in cross-section.

Referring first to FIGS. 1 through 5, the thermoelectric module according to the first embodiment of the present invention will hereinafter be described. Plural (two in this embodiment) outer heat-absorbing-side thermal conductors, namely, a first outer heat-absorbing-side thermal conductor 2a and a second outer heating-absorbing-side thermal conductor 2b, each in the form of a block made of aluminum, are integrally joined to an inner heat-absorbing-side thermal conductor 1 made, for example, of aluminum at predetermined positions thereof. A first heat-dissipating-side conductor 3a and a second heat-dissipating-side conductor 3b are arranged apart from each other (i.e., in a divided form) at positions opposite to the first outer heat-absorbing-side thermal conductor 2a and the second outer heating-absorbing-side thermal conductor 2b, respectively. The first heat-dissipating-side conductor 3a and the second heat-dissipating-side conductor 3b are integrally provided with a number of heat-dissipating fins 5a,5b, respectively, so that the first and second heat-dissipating-side conductors 3a,3b can be cooled efficiently by air. Incidentally, the heat-absorbing-side thermal conductors 2a,2b and the heat-dissipating-side thermal conductors 3a,3b have been subjected to insulating treatment such as anodized alumina treatment.

Figure 5:
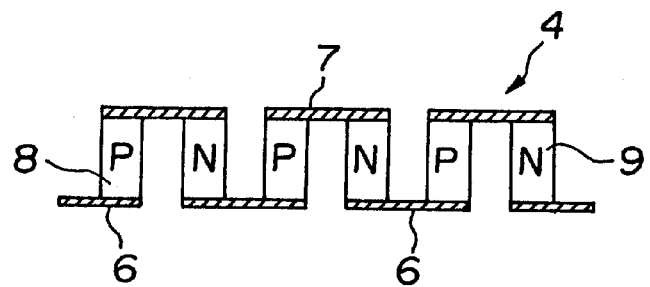
FIG. 5 is an enlarged cross-sectional view of a group of skeleton-type thermoelectric elements useful in the thermoelectric module.

A first group of thermoelectric elements (hereinafter referred to as "the first thermoelectric element group") 4a is arranged between the first outer heat-absorbing-side thermal conductor 2a and the first heat-dissipating-side thermal conductor 3a, while a second group of thermoelectric elements (hereinafter referred to as "the second thermoelectric element group") 4b is disposed between the second outer heat-absorbing-side thermal conductor 2b and the second heat-dissipating-side thermal conductor 3b. These thermoelectric element groups 4a,4b are each of the skeleton type with substrates on both sides or a substrate on one side having been omitted. As is illustrated in FIG. 5, the thermoelectric element groups 4a,4b are each constructed of a predetermined number of heat-absorbing-side electrodes 6 and heat-dissipating-side electrodes 7 and P-type semiconductor chips 8 and N-type semiconductor chips 9 interposed between the heat-absorbing-side electrodes 6 and the heat-dissipating-side electrodes 7. The P-type semiconductor chips 8 and the N-type semiconductor chips 9 are connected in series by the electrodes 6,7.

Surrounding the first outer heat-absorbing-side thermal conductor 2a and the first thermoelectric element group 4a, a first frame 10a is arranged between the inner heat-absorbing-side thermal conductor 1 and the first heat-dissipating-side thermal conductor 3a. On the other hand, surrounding the second outer heat-absorbing-side thermal conductor 2b and the second thermoelectric element group 4b, a second frame 10b is disposed between the inner heat-absorbing-side thermal conductor 1 and the second heat-dissipating-side thermal conductor 3b.

Figure 2:
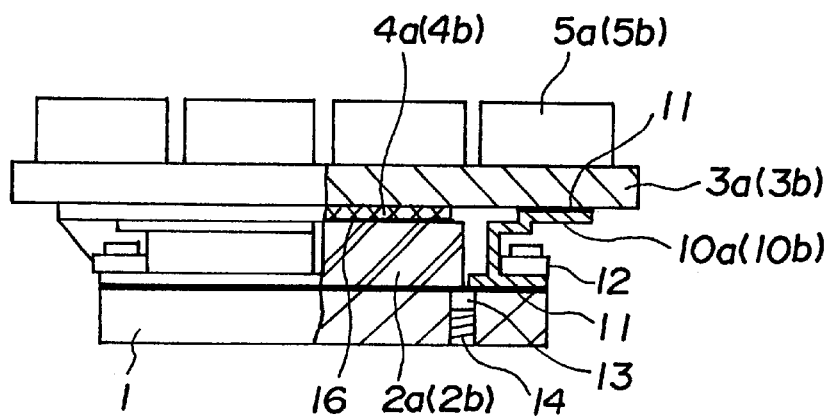
FIG. 2 is a side view of the thermoelectric module, in which a part of the thermoelectric module is illustrated in cross-section.
Figure 4:
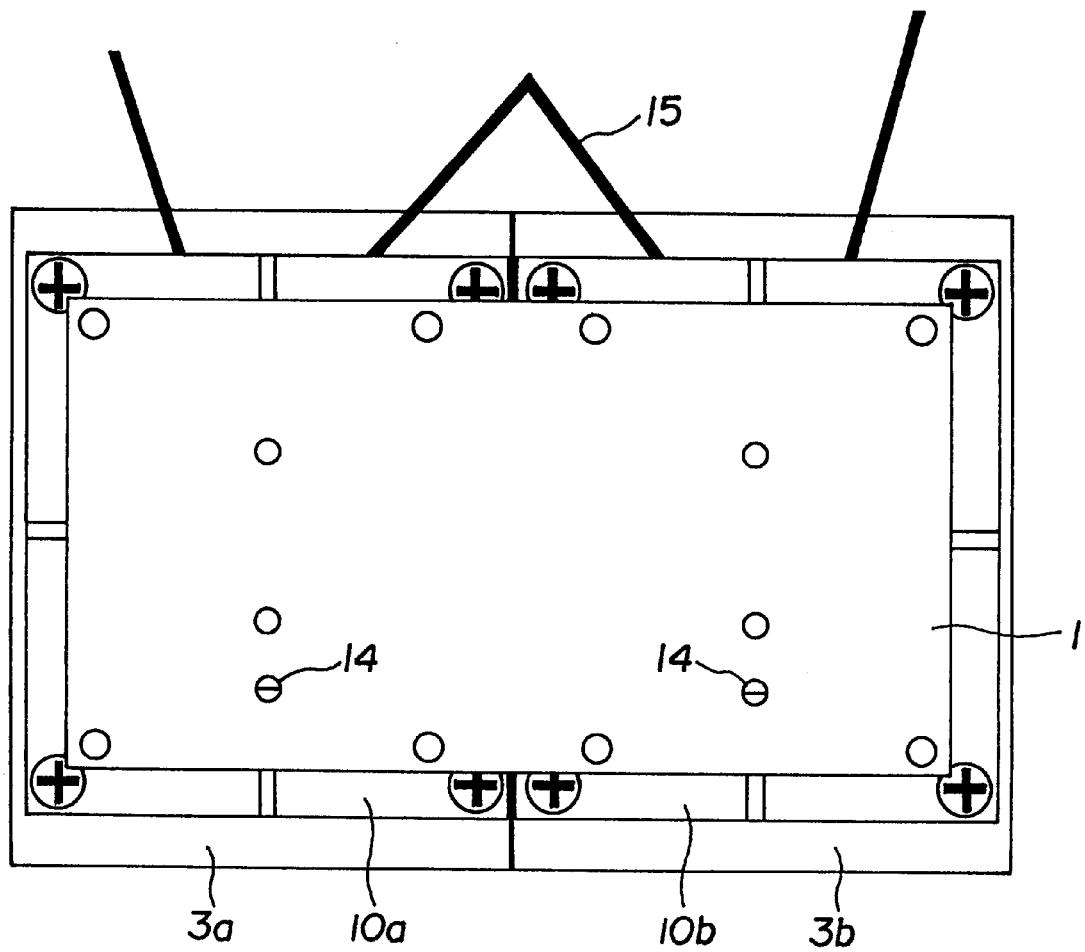
FIG. 4 is a bottom view of the thermoelectric module.

The frames 10a,10b are formed of a synthetic resin. By adhesives 11 and screws 12, the inner heat-absorbing-side thermal conductor 1 and the frames 10a,10b are joined together in a gas- and liquid-tight fashion at their contacting surfaces and the heat-dissipating-side thermal conductors 3a,3b and the frames 10a,10b are joined together in a gas- and liquid-tight fashion at their contacting surfaces. Incidentally, fastening by the screws 12 is conducted after the adhesives 11 have hardened. As is illustrated in FIG. 2 and FIG. 4, plural outgassing holes 13 are formed through the inner heat-absorbing-side thermal conductor 1 at positions inside each of the frames 10a,10b. Subsequent to hardening of the adhesives 11, the outgassing holes 13 are closed up by sealing screws 14. If the outgassing holes 13 were not formed, air in the frames would push out unhardened adhesives 11 when a joined unit of the heat-dissipating-side thermal conductors 3a,3b, the thermoelectric element groups 4a,4b and the frames 10a,10b is adhered on the heat-absorbing-side thermal conductor 1. As a consequence, gaps would be formed, through which moisture in air penetrates inside the thermoelectric module, leading to a deterioration in performance. The outgassing holes 13 are formed to avoid such a problem. After outgassing, the outgassing holes 13 are closed up by the sealing screws 14.

Designated at numeral 16 in FIG. 1 and FIG. 2 are thin elastic films formed of a material having good thermal conductivity such as a silicone gel. The thin elastic films are interposed between the outer heat-absorbing-side thermal conductors 2a,2b and the corresponding thermoelectric element groups 4a,4b.

Figure 3:
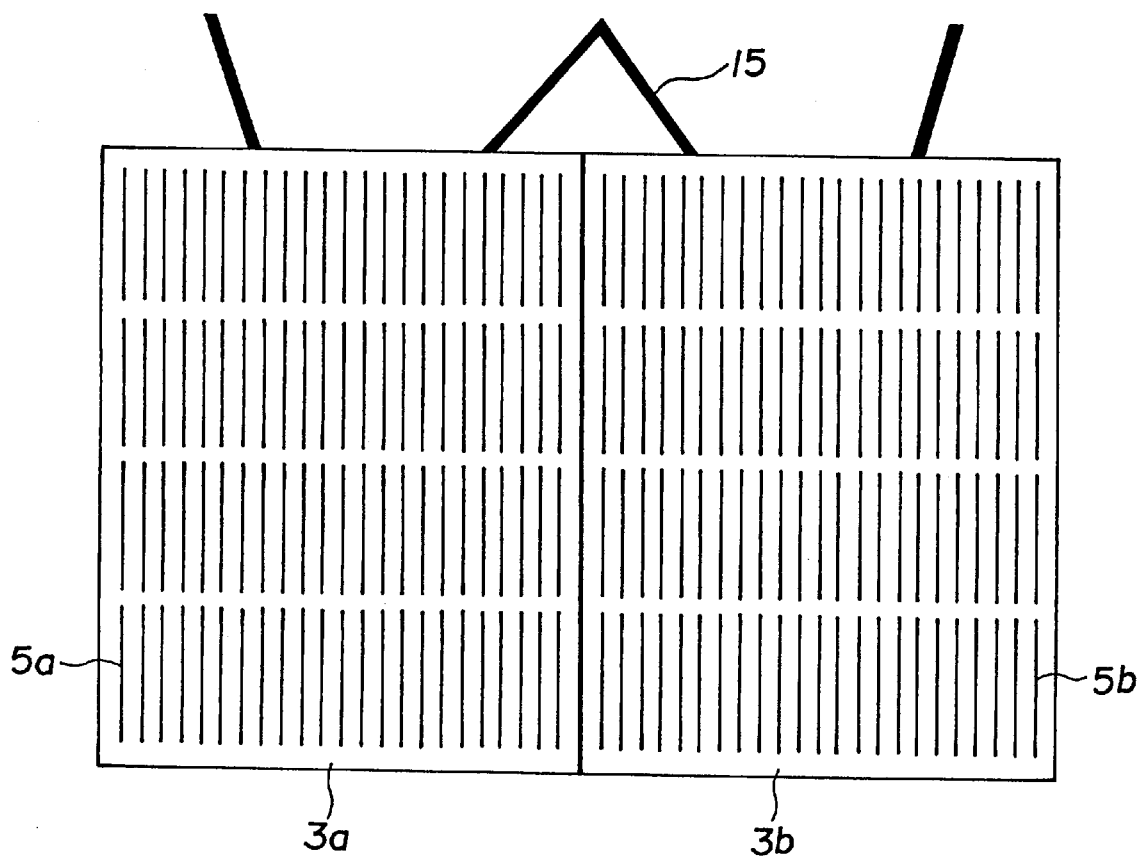
FIG. 3 is a plan view of the thermoelectric module.

In FIG. 3 and FIG. 4, numeral 15 indicates lead wires. In this embodiment, the first thermoelectric element group 4a and the second thermoelectric element group 4b are connected in series. As an alternative, these thermoelectric element groups may also be connected in parallel.

A description will next be made about assembling steps of the thermoelectric module.

(i) The thermoelectric element groups 4a,4b are bonded to the corresponding heat-dissipating-side thermal conductors 3a,3b.

(ii) The lead wires 15 are connected to the thermoelectric element groups 4a,4b.

(iii) On the heat-dissipating-side thermal conductors 3a,3b with the thermoelectric element groups 4a,4b attached thereto, the frames 10a,10b are bonded with the adhesives 11 and then screwed, respectively.

(iv) The thin elastic films 16 are coated and formed on the surfaces of the heat-dissipating-side thermal conductors 2a,2b, respectively. Further, the adhesives 11 are coated on the heat-absorbing-side thermal conductor 1 at the surfaces thereof where the frames 10a,10b are to be adhered (to such a thickness that the adhesives 11 fill up gaps between the heat-absorbing-side thermal conductor 1 and the frames 10a,10b).

(v) The unit of the heat-dissipating-side thermal conductors 3a,3b, the thermoelectric element groups 4a,4b and the frames 10a,10b, said unit having been formed in the step (iii), is placed over the heat-absorbing-side thermal conductor 1 prepared in the step (iv).

(vi) After the adhesives have hardened, the heat-absorbing-side thermal conductor 1 and the frames 10a,10b are fastened together by the screws (to avoid separation).

(vii) The outgassing holes 13 are closed up with the screws 14. If desired, an adhesive may then be applied over the screws 14 to further assure the sealing.

Figure 6:
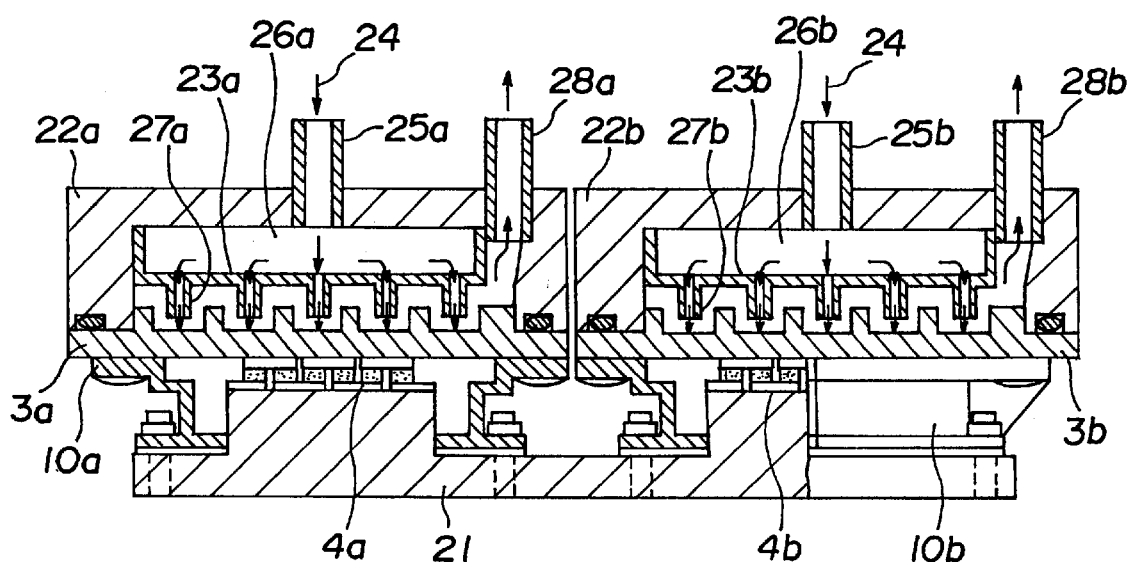
FIG. 6 is a front view of a thermoelectric module according to a second embodiment of the present invention, in which a majority of the thermoelectric module is depicted in cross-section.
Figure 7:
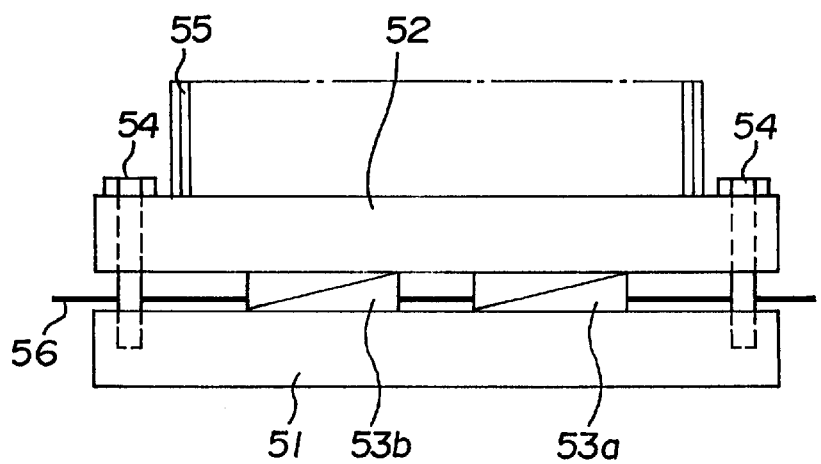
FIG. 7 is the schematic front view of the conventional thermoelectric module.

Referring now to FIG. 6, the thermoelectric module according to the second embodiment of the present invention will hereinafter be described. This second embodiment is different from the first embodiment in that the inner heat-absorbing-side thermal conductor 1 and the outer heat-dissipating-side thermal conductors 2a,2b have been integrated into a heat-absorbing-side thermal conductor 21 and the cooling system on the heat-dissipating side has been changed from air cooling to water cooling.

Described specifically, the heat-dissipating side is constructed primarily of divided heat-dissipating-side thermal conductors 3a,3b, casings 22a,22b with lower openings thereof joined in a liquid-tight fashion with the corresponding heat-dissipating-side thermal conductors 3a,3b, and distributing members 23a,23b arranged inside the respective casings 22a,22b.

When a heat transfer medium 24 such as water is supplied through inlet pipes 25a,25b, the heat transfer medium 24 instantaneously spreads out in spaces 26a,26b and is forcedly sprayed toward the heat-dissipating-side thermal conductors 3a,3b through spray nozzles 27a,27b. The heat transfer medium 24, which has hit the heat-dissipating-side thermal conductors 3a,3b and has absorbed heat therefrom, is collected and is then discharged out of the system through outlet pipes 28a,28b. The thus-discharged heat transfer medium 24 is cooled at an unillustrated radiator and is then used again through a recirculation system.

As is illustrated in FIG. 1 and FIG. 6, the formation of a gap between the divided thermal conductors (namely, between the first heat-dissipating-side thermal conductor 3a and the second heat-dissipating-side thermal conductor 3b) involves a potential problem that air, which flows through the gap, may reach a side of the other thermal conductor located opposite the divided thermal conductors, thereby causing a back flow of heat. This problem is most likely especially in a thermoelectric module of a type that air is forced to flow around the thermoelectric module.

To avoid the potential problem, it is preferred to adopt such a construction that a filler having elasticity of such a degree as being capable of absorbing a variation in height between thermoelectric element groups, for example, a silicone rubber is filled between the divided thermal conductors to prevent air from flowing therebetween.

In each of the above-described embodiments, the heat-dissipating side was divided into plural sections. Conversely, the heat-absorbing-side may be divided. The number of the thus-divided sections is not limited to 2 but can be 3 or more.

Concerning the expression "a thermal conductor is substantially in a form of a single piece" as used herein, it should be noted that this expression be interpreted to include a thermal conductor formed of plural pieces of thermal conductors connected together into a planar configuration.

In the above-describe embodiments, skeleton-type thermoelectric element groups were employed. This invention is however not limited to them. General-type thermoelectric element groups making use of substrates can also be used.

What is claimed is:

1. A thermoelectric module provided with plural groups of thermoelectric elements arranged between a heat-absorbing-side thermal conductor and a heat-dissipating-side thermal conductor, wherein one of said heat-absorbing-side and heat-dissipating-side thermal conductors is substantially in single piece form, said plural groups of thermoelectric elements are arranged relative to said one of said heat-absorbing-side and heat-dissipating-side thermal conductors, and corresponding to said plural groups of thermoelectric elements, the other one of said heat-absorbing-side and heat-dissipating-side thermal conductors is arranged in a divided form.

2. A thermoelectric module according to claim 1, wherein said plural groups of thermoelectric elements are each in a form of a group of skeleton thermoelectric elements.

3. A thermoelectric module according to claim 1, wherein said plural groups of thermoelectric elements are individually surrounded in a gas- and liquid-tight fashion by corresponding frames arranged between said one of said heat-absorbing-side and heat-dissipating-side thermal conductors in single piece form and said other one of said heat-absorbing-side and heat-dissipating-side thermal conductors in the divided form.

4. A thermoelectric module according to claim 3, wherein outgassing holes are formed in communication with spaces surrounded by said heat-absorbing-side thermal conductor, said the other thermal conductor and said frames, respectively; an adhesive is applied to provide adhesion at least partially between said thermal conductors and said plural groups of thermoelectric elements and between said thermal conductors and said frames; and said outgassing holes are sealed.

5. A thermoelectric module according to claim 1, further comprising thin elastic films interposed between at least one of said thermal conductors and said plural groups of thermoelectric elements.

6. A thermoelectric module according to claim 1, further comprising an elastic filler interposed between said divided thermal conductors.

* * * * *